United States Patent
Omura et al.

(10) Patent No.: US 9,443,832 B2
(45) Date of Patent: Sep. 13, 2016

(54) LIGHT EMITTING DEVICE, LIGHT SOURCE FOR ILLUMINATION, AND ILLUMINATION APPARATUS

(71) Applicant: PANASONIC INTELLECTUAL PROPERTY MANAGEMENT CO., LTD., Osaka (JP)

(72) Inventors: Koji Omura, Osaka (JP); Tomoya Iwahashi, Osaka (JP); Kohji Hiramatsu, Osaka (JP); Ran Zheng, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 12 days.

(21) Appl. No.: 14/591,292

(22) Filed: Jan. 7, 2015

(65) Prior Publication Data
US 2015/0194412 A1    Jul. 9, 2015

(30) Foreign Application Priority Data

Jan. 8, 2014 (JP) .................................. 2014-001759

(51) Int. Cl.
*H01L 33/00* (2010.01)
*H01L 25/075* (2006.01)
*H01L 33/64* (2010.01)

(52) U.S. Cl.
CPC ......... *H01L 25/0753* (2013.01); *H01L 33/641* (2013.01); *H01L 33/644* (2013.01); *H01L 2224/45144* (2013.01); *H01L 2224/48091* (2013.01); *H01L 2224/48139* (2013.01); *H01L 2224/48484* (2013.01)

(58) Field of Classification Search
CPC ........................... H01L 33/642; H01L 33/647

USPC ................. 438/28, 35; 257/88, 91, E33.062, 257/E33.065, E33.075
See application file for complete search history.

(56) References Cited

U.S. PATENT DOCUMENTS

| | | | |
|---|---|---|---|
| 2005/0082974 A1* | 4/2005 | Fukasawa et al. | ............ 313/512 |
| 2006/0141851 A1 | 6/2006 | Matsui et al. | |
| 2006/0186431 A1* | 8/2006 | Miki | ..................... H01L 33/505 257/100 |
| 2008/0128718 A1 | 6/2008 | Sumitani | |
| 2008/0231214 A1* | 9/2008 | Kim | ..................... A61N 5/0618 315/360 |
| 2009/0001392 A1* | 1/2009 | Lee | ................................. 257/89 |
| 2009/0152572 A1* | 6/2009 | Su | ............................. F21K 9/00 257/89 |
| 2011/0222264 A1 | 9/2011 | Matsuda et al. | |

(Continued)

FOREIGN PATENT DOCUMENTS

| | | |
|---|---|---|
| JP | 10-321909 | 12/1998 |
| JP | 2004-265626 | 9/2004 |
| JP | 2007-078365 | 3/2007 |

(Continued)

*Primary Examiner* — Kimberly Rizkallah
*Assistant Examiner* — Maria Ligai
(74) *Attorney, Agent, or Firm* — Greenblum & Bernstein, P.L.C.

(57) ABSTRACT

A light emitting device includes: a substrate; a first light emitting element and a second light emitting element that are mounted above the substrate; and a heat transfer pattern that is formed on the substrate. A rate of decrease in light output with respect to a temperature increase is greater for the second light emitting element than for the first light emitting element. The second light emitting element is mounted above the substrate via the heat transfer pattern, and the first light emitting element is mounted above the substrate without the heat transfer pattern.

11 Claims, 8 Drawing Sheets

(56) References Cited

U.S. PATENT DOCUMENTS

2012/0012867 A1* 1/2012 Shen et al. ............... 257/89
2014/0159077 A1* 6/2014 Kuenzler ............ H05K 1/0209
257/89

FOREIGN PATENT DOCUMENTS

| JP | 2008-160091 | 7/2008 |
| JP | 2011-216868 | 10/2011 |
| JP | 2012-227249 | 11/2012 |

* cited by examiner

【Comparative example】

【The present disclosure】

LIGHT EMITTING DEVICE, LIGHT SOURCE FOR ILLUMINATION, AND ILLUMINATION APPARATUS

BACKGROUND OF THE INVENTION

1. Field of the Invention

The present disclosure relates to a light emitting device, a light source for illumination, and an illumination apparatus.

2. Description of the Related Art

Semiconductor light emitting elements such as light emitting diodes (LEDs) have a small size, a high efficiency, and a long life and thus have been used as a light source of various products for illumination and display, etc.

The LEDs have been used in an LED lamp as a light source for illumination, for example. The LED lamp can be a bulb-shaped LED lamp (an LED bulb) as a substitute for a bulb-shaped fluorescent lamp or an incandescent lamp, or a straight tube LED lamp as a substitute for a straight tube fluorescent lamp.

Also, the LEDs are used as an LED luminaire or the like as a substitute for a luminaire having a high directivity such as a downlight or a spotlight used in a store or the like.

In the LED lamp and the LED luminaire, the LEDs are incorporated into a unit as an LED module emitting device) that emits light of a predetermined color such as white light.

For example, the LED module used in the bulb-shaped LED lamp or the straight tube LED lamp generates white light by a blue LED chip that emits blue light and a yellow phosphor that emits fluorescence by blue light from the blue LED chip.

Such an LED module achieves a poor color rendition because the generated white light has a small reddish component. Accordingly, a method is also conceived of compensating for the reddish component by adding to the above-described LED module a red phosphor that emits fluorescence by blue light.

However, at the moment, the red phosphor has a lower energy conversion efficiency than the yellow phosphor. Thus, the LED module achieves a reduced light emission efficiency. Then, a technique has been studied of adding a red LED chip that emits red light instead of the red phosphor so as to improve the color rendition.

For example, Japanese Unexamined Patent Application Publication No. 2011-216868 discloses an LED module having a blue LED chip, a red LED chip, and a yellow phosphor. This achieves the LED module that emits white light having excellent color rendition.

SUMMARY OF THE INVENTION

A light emitting device is a light emitting module including light emitting elements, and includes: a substrate; a first light emitting element and a second light emitting element that are mounted above the substrate; and a heat transfer pattern that is formed on the substrate. A rate of decrease in light output with respect to a temperature increase is greater for the second light emitting element than for the first light emitting element. The second light emitting element is mounted above the substrate via the heat transfer pattern. The first light emitting element is mounted above the substrate without the heat transfer pattern.

With the present disclosure, it is possible to both improve color rendition and suppress color shift.

DETAILED DESCRIPTION OF THE PREFERRED EMBODIMENTS

Prior to the exemplary embodiments disclosed herein, a problem in a light emitting device in a related art will be described.

In a blue-yellow type LED module that generates white light by a combination of a blue LED chip and a yellow phosphor, color rendition improves by further incorporating a red phosphor. In this case, for example, the yellow phosphor and the red phosphor are contained in a sealing member that seals the blue LED chip.

Under excitation by blue light, the red phosphor has a lower energy conversion efficiency than the yellow phosphor. Thus, the LED module in which the blue LED chip is combined with the yellow phosphor and the red phosphor achieves a lower light emission efficiency than the LED module in which the blue LED chip is combined with the yellow phosphor.

In the LED module in which the blue LED chip is combined with the yellow phosphor and the red phosphor, a half-value width of an emission spectrum of the red phosphor is large. Thus, a large amount of light in a wavelength range away from around 555 nm, which is a wavelength at which a human has a highest visibility, is emitted.

Figure 1:
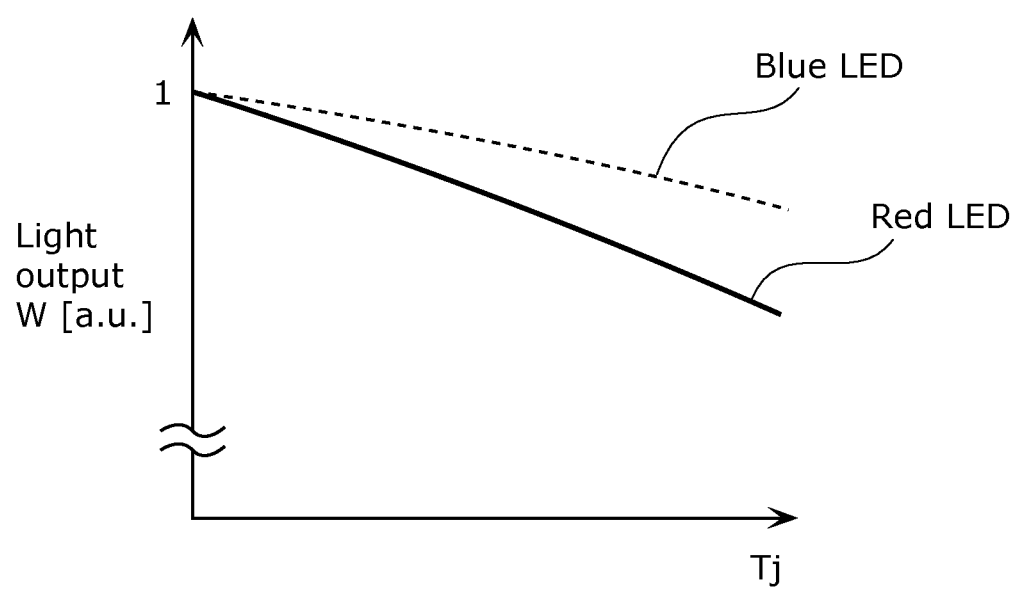
FIG. 1 is a graph showing temperature characteristics of a blue LED chip and a red LED chip.

On the other hand, the blue LED chip and the red LED chip have different rates of decrease in light output with respect to a temperature increase [%/° C.] (temperature characteristics). Thus, in the LED module including the blue LED chip and the red LED chip, the ratio of light output between the blue LED chip and the red LED chip varies, resulting in a variation of light color of the LED module. This will be described with reference to FIG. 1. FIG. 1 is a graph showing temperature characteristics of the blue LED chip and the red LED chip. In this figure, an operating current for each LED is constant. A vertical axis in FIG. 1 indicates relative light output of each of the blue LED chip and the red LED chip when the light output (light flux) at a predetermined junction temperature (for example, 25° C.) is given as 1.

As illustrated in FIG. 1, both the blue LED chip and the red LED chip have lower light output as the junction temperature (Tj) rises. However, compared with the blue LED chip, the red LED chip has a greater rate of change in the light output with respect to the temperature change.

More specifically, as illustrated in FIG. 1, the rate of decrease in the light output with respect to a temperature increase is greater for the red LED chip than for the blue LED chip. Conversely, the rate of decrease in the light output with respect to a temperature increase is less for the blue LED chip than for the red LED chip. In other words, the red LED chip is inferior in the temperature characteristics to the blue LED chip, and the blue LED chip is superior in the temperature characteristics to the red LED chip.

If the blue LED chip and the red LED chip had equivalent temperature characteristics, they would have equivalent rates of decrease in the light output with respect to a temperature increase. In that case, even when their light output decreases with the temperature increase, the ratio of the light output between them do not vary. Accordingly, there is no color shift owing to the temperature increase in the LED module. However, since the temperature characteristics of the red LED chip is inferior to that of the blue LED chip as described above, the light output of the red LED chip decreases further than that of the blue LED chip. In the LED module including the blue LED chip and the red LED chip, the temperatures of the blue LED chip and the red LED chip increase with a lapse of time from power-on (lighting-up), so that the ratio of light output between them varies. Accordingly, emission color of the light emitted from the LED module varies. This is recognized as the color shift.

The following is a description of embodiments of the present disclosure with reference to the accompanying drawings. Any of the embodiments described below will illustrate one specific preferable example of the present disclosure. Thus, the numerical values, shapes, materials, structural components, the arrangement and connection of the structural components, steps and the order of the steps mentioned in the following embodiments are merely an example and not intended to limit the present disclosure.

Incidentally, each of the figures is a schematic view and not necessarily illustrated in a strict manner. Furthermore, in each of the figures, substantially the same structures are assigned the same reference signs, and the redundant description of such structures will be omitted or simplified in some cases.

First Exemplary Embodiment

Figure 2:
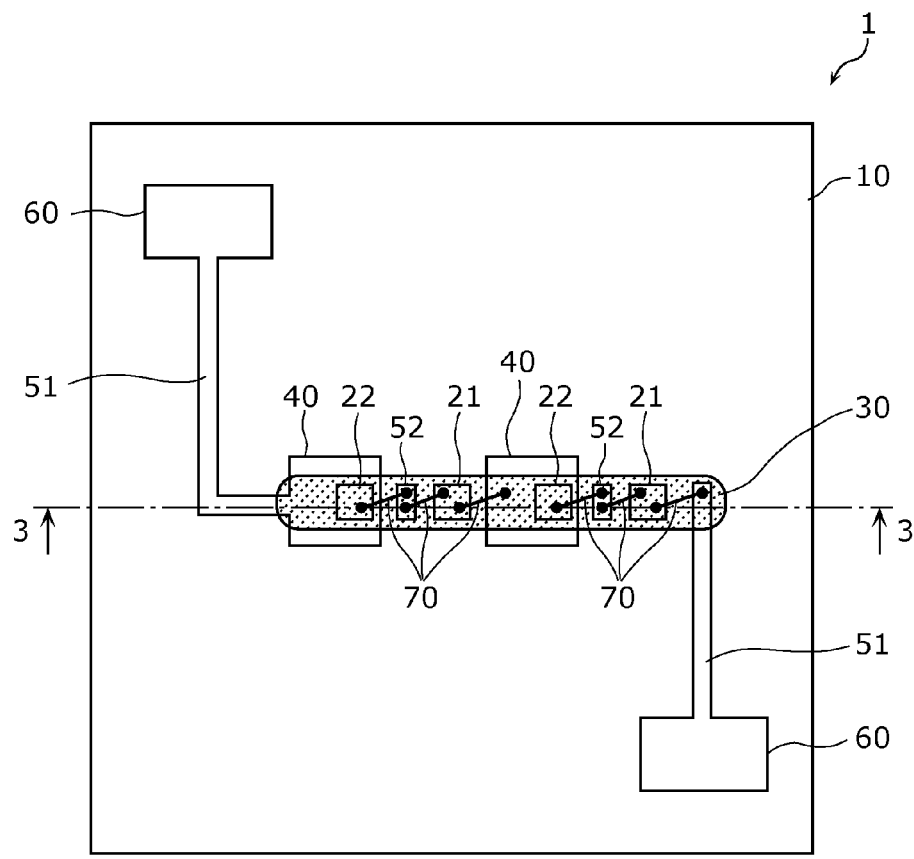
FIG. 2 is a plan view illustrating a light emitting device according to a first exemplary embodiment.
Figure 3:
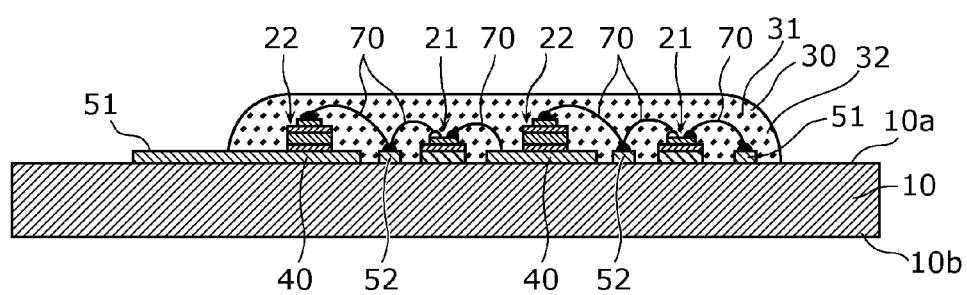
FIG. 3 is a sectional view illustrating the light emitting device taken along a line 3-3 in FIG. 2.

First, a configuration of light emitting device 1 according to a first exemplary embodiment will be described with reference to FIG. 2 and FIG. 3. FIG. 2 is a plan view illustrating the light emitting device according to the first exemplary embodiment, and FIG. 3 is a sectional view illustrating the light emitting device taken along a line 3-3 in FIG. 2.

As illustrated in FIG. 2, light emitting device 1 is a light emitting module including light emitting elements, and includes substrate 10, first light emitting elements 21 and second light emitting elements 22 that are mounted above substrate 10, and heat transfer patterns 40 that are formed on substrate 10.

The rate of decrease in the light output with respect to a temperature increase is greater for second light emitting element 22 than for first light emitting element 21. For example, first light emitting element 21 is a blue LED chip, and second light emitting element 22 is a red LED chip. First light emitting element 21 is mounted above substrate 10 without heat transfer pattern 40, whereas second light emitting element 22 is mounted above substrate 10 via heat transfer pattern 40.

Furthermore, light emitting device 1 further includes sealing member 30 that seals at least first light emitting elements 21, wiring patterns 51 that are formed in a predetermined shape on substrate 10, wire pads 52 that are disposed between light emitting elements above substrate 10, a pair of feed terminals 60, and wires 70.

Light emitting device 1 is an LED module having a chip-on-board (COB) structure in which LED chips are directly mounted on substrate 10, and is configured to emit white light. Hereinafter, each of structural components of light emitting device 1 will be detailed with reference to FIG. 2 and FIG. 3.

[Substrate]

Substrate 10 is a mounting substrate for mounting first light emitting elements 21 and second light emitting elements 22 thereon. Substrate 10 has a plate shape, and has first principal surface (front surface) 10a and second principal surface (back surface) 10b that is opposite from first principal surface 10a.

Substrate 10 can be a ceramic substrate, a resin substrate, a metal base substrate, a glass substrate or the like.

The ceramic substrate can be an alumina substrate, an aluminum nitride substrate or the like. The resin substrate can be, for example, a glass epoxy substrate, a flexible substrate formed of a material such as polyimide, or the like. The metal base substrate can be, for example, an aluminum alloy substrate, an iron alloy substrate, a copper alloy substrate or the like whose surface is provided with an insulating film.

In the present embodiment, a white ceramic substrate is used as substrate 10. More specifically, a polycrystalline alumina substrate (polycrystalline ceramic substrate) that is formed by burning alumina particles and has a thickness of about 1 mm, for example, is used as substrate 10.

The ceramic substrate has a higher thermal conductivity than the resin substrate, and can efficiently dissipate heat from first light emitting elements 21 and second light emitting elements 22. Furthermore, the ceramic substrate has less time degradation and excellent heat resistance. Moreover, by using a white substrate, it becomes possible to reflect light from first light emitting elements 21 and second light emitting elements 22 by the front surface of substrate 10, so that a light extraction efficiency of light emitting device 1 can be improved.

Although a rectangular substrate is used as substrate 10 in the present embodiment, a shape of substrate 10 is not limited to a rectangle. For example, the shape of substrate 10 may be a circle, a polygon having five or more vertices, a triangle, an ellipse, or any other shapes. Additionally, depending on specifications (products), an elongated rectangular substrate may be used.

[Light Emitting Element]

Both of first light emitting element 21 and second light emitting element 22 are mounted on first principal surface 10a of substrate 10. Second light emitting element 22 is mounted above substrate 10 via heat transfer pattern 40. First light emitting element 21 is mounted on substrate 10 without heat transfer pattern 40. More specifically, first light emitting element 21 is mounted on first principal surface 10a of substrate 10, whereas second light emitting element 22 is mounted on heat transfer pattern 40.

In the present embodiment, each of the number of first light emitting elements 21 and the number of second light emitting elements 22 is more than one. More specifically, as illustrated in FIG. 2, each of the number of first light emitting elements 21 and that of second light emitting elements 22 is two, and first light emitting elements 21 and second light emitting elements 22 are mounted alternately in a line.

First light emitting element 21 and second light emitting element 22 are, for example, a semiconductor light emitting element that emits light of a predetermined color by predetermined electric power, and are a bare chip emitting visible light of a single color.

More specifically, as described above, first light emitting element 21 is a blue LED chip that emits blue light when energized. First light emitting element 21 is a gallium nitride (GaN) semiconductor light emitting element having an emission peak at wavelengths ranging from 440 nm to 470 nm, for example. On the other hand, second light emitting element 22 is a red LED chip that emits red light when energized. Second light emitting element 22 is an aluminum gallium indium phosphide (AlGaInP) semiconductor light emitting element having an emission peak at wavelengths ranging from 630 nm to 660 nm, for example.

As illustrated in FIG. 3, both of first light emitting element 21 and second light emitting element 22 have a structure having a plurality of semiconductor layers stacked on a substrate. First light emitting element 21 has a configuration in which both of a p-side electrode and an n-side electrode are formed on an upper surface of the semiconductor layer disposed on a sapphire substrate. In other words, first light emitting element 21 has a single-sided electrode structure. On the other hand, second light emitting element 22 has a configuration in which a p-side electrode (upper surface electrode) is formed on an upper surface of the semiconductor layer disposed on an electrically-conductive substrate and an n-side electrode (lower surface electrode) is formed on a lower surface of the electrically-conductive substrate. In other words, second light emitting element 22 has a double-sided electrode structure.

Thus, in first light emitting element 21, one wire 70 is connected to each of the two electrodes (the p-side electrode and the n-side electrode) on the upper surface. On the other hand, in second light emitting element 22, heat transfer pattern 40 is electrically connected to the lower surface electrode (n-side electrode), and wire 70 is connected to the upper surface electrode (p-side electrode).

First light emitting element 21 and second light emitting element 22 are mounted to substrate 10 using, for example, an electrically-conductive adhesive such as silver paste or solder. It should be noted that first light emitting element 21 may be mounted by, for example, die bonding using a die attaching agent or the like.

Furthermore, in the present embodiment, as illustrated in FIG. 2, second light emitting element 22 is mounted in an end portion of heat transfer pattern 40. This allows second light emitting element 22 to be located close to first light emitting element 21. In other words, a distance between second light emitting element 22 and first light emitting element 21 can be made small. Consequently, it is possible to suppress color unevenness.

Incidentally, each of the number of mounted first light emitting elements 21 and the number of mounted second light emitting elements 22 is not limited to two but may be one or greater than two. Furthermore, a ratio between the number of mounted first light emitting elements 21 and the number of mounted second light emitting elements 22 is not limited to 1 to 1 but may be other ratios such as 2 to 1. Moreover, first light emitting elements 21 and second light emitting elements 22 are not only mounted in a line but may be mounted in plural lines or in a matrix. Additionally, first light emitting element 21 and second light emitting element 22 do not have to be arranged alternately.

[Sealing Member]

Sealing member 30 is configured to cover first light emitting elements 21 and second light emitting elements 22. Sealing member 30 in the present embodiment is formed linearly along an alignment direction of first light emitting elements 21 and second light emitting elements 22 in such a manner as to collectively seal first light emitting elements 21 and second light emitting elements 22 that are aligned.

Sealing member 30 contains wavelength conversion material 31 that is excited by light from first light emitting element 21 to emit light at a wavelength different from a wavelength of light from first light emitting element 21, and light-transmitting material 32 containing wavelength conversion material 31.

Light-transmitting material 32 contained in sealing member 30 can be a light-transmitting insulating resin material such as a silicone resin, an epoxy resin or a fluorine resin, for example. The light-transmitting material is not necessarily limited to an organic material such as a resin material but may be an inorganic material such as a low melting glass or a sol-gel glass.

Also, wavelength conversion material 31 contained in sealing member 30 is, for example, a phosphor. The phosphor is contained in light-transmitting material 32, and is excited by light emitted from first light emitting element 21 to emit fluorescent light of a predetermined color (at a predetermined wavelength).

In the present embodiment, since first light emitting element 21 is a blue LED chip, the phosphor can be, for example, an yttrium-aluminum-garnet (YAG) yellow phosphor in order to obtain white light. In this way, a portion of blue light emitted from the blue LED chip is absorbed by the yellow phosphor, and a wavelength of the portion of blue light is converted to a wavelength of yellow light. In other words, the yellow phosphor is excited by the blue light from the blue LED chip to emit the yellow light. This yellow light from the yellow phosphor and the blue light that is not absorbed by the yellow phosphor are combined to generate white light as synthesized light, and sealing member 30 emits this white light.

It should be noted that the yellow phosphor is not excited by red light from second light emitting element 22, which is a red LED chip. Additionally, it may be also possible to disperse a light diffusion material such as silica in sealing member 30 in order to enhance a light diffusion property.

Sealing member 30 in the present embodiment is a phosphor-containing resin obtained by dispersing a yellow phosphor in a silicone resin. Such sealing member 30 can be formed into a predetermined shape by applying sealing member 30 to substrate 10 using a dispenser, followed by curing. An outer shape of sealing member 30 formed as above is cylindrical, and a cross-section of sealing member 30 taken along a plane perpendicular to a longitudinal direction of sealing member 30 is substantially semi-circular.

Although both of first light emitting element 21 and second light emitting element 22 are sealed by sealing member 30 in the present embodiment, second light emitting element 22 does not have to be sealed. Also, second light emitting element 22 can be sealed for protection. In this case, a sealing member for sealing second light emitting element 22 does not have to contain a phosphor.

Although first light emitting element 21 and second light emitting element 22 are collectively sealed by sealing member 30 in the present embodiment, these light emitting elements may be sealed individually.

[Heat Transfer Pattern]

Heat transfer pattern 40 is a plate-like or a film-like electrically-conductive component that has a thermal conductivity, and is formed in a predetermined shape on the first principal surface of substrate 10. As mentioned earlier, second light emitting element 22 is mounted on heat transfer pattern 40.

As illustrated in FIG. 2, heat transfer pattern 40 in the present embodiment is larger than second light emitting element 22 in plan view, and second light emitting element 22 is mounted in a region where heat transfer pattern 40 is formed. In this way, heat generated in second light emitting element 22 diffuses widely in heat transfer pattern 40, so that a temperature increase of heat transfer pattern 40 can be suppressed.

Moreover, heat transfer pattern 40 has a higher thermal conductivity than substrate 10. Accordingly, by mounting second light emitting element 22 on a surface of heat transfer pattern 40 and mounting first light emitting element 21 on the surface of substrate 10, heat generated in second light emitting element 22 can be dissipated relatively more efficiently than heat generated in first light emitting element 21.

Heat transfer pattern 40 is a metal pattern formed of a metallic material, for example. A material of heat transfer pattern 40 can be a metallic material having a high thermal conductivity such as gold (Au), silver (Ag) or copper (Cu). In the present embodiment, heat transfer pattern 40 is formed of gold.

The material of heat transfer pattern 40 may be the same as that of wiring pattern 51. This makes it possible to form heat transfer pattern 40 and wiring pattern 51 by patterning in a single process.

Furthermore, in the present embodiment, heat transfer pattern 40 is electrically connected to wiring pattern 51. In other words, heat transfer pattern 40 has not only a heat dissipating function but also a function as a power feed line. Thus, an operating current for operating (causing light emission from) first light emitting element 21 and second light emitting element 22 flows through heat transfer pattern 40.

With this configuration, when second light emitting element 22, which is an LED chip with a double-sided electrode structure, is mounted, the lower surface electrode of second light emitting element 22 and heat transfer pattern 40 can be electrically connected easily only by mounting second light emitting element 22 on heat transfer pattern 40. Incidentally, the upper surface electrode of second light emitting element 22 is connected to another heat transfer pattern 40 by wire bonding using wire 70.

As illustrated in FIG. 2, heat transfer pattern 40 in the present embodiment has a rectangular shape. However, heat transfer pattern 40 may have other shapes such as a circular shape.

[Wiring Pattern, Wire Pad]

Wiring pattern 51 is a power feed line provided for supplying first light emitting element 21 and second light emitting element 22 with an electric power for causing first light emitting element 21 and second light emitting element 22 to emit light. As illustrated in FIG. 2, wiring pattern 51 is formed in a predetermined shape on the first principal surface of substrate 10, and extends from feed terminal 60.

Wire pad 52 is formed in an insular manner between two adjacent light emitting elements in the first principal surface of substrate 10. In the present embodiment, wire pad 52 has a rectangular shape and is located between first light emitting element 21 and second light emitting element 22. First light emitting element 21 and second light emitting element 22 are electrically connected by wires 70 via wire pad 52. Wiring pattern 51 and wire pad 52 are, for example, metal lines formed of a metallic material such as Au, Ag or Cu. In the present embodiment, wiring pattern 51 and wire pad 52 are formed by patterning using the same metallic material in a single process.

[Feed Terminal]

A pair of feed terminals 60 are formed on the first principal surface of substrate 10. The pair of feed terminals 60 are external connection terminals (electrode terminals) for receiving predetermined electric power from a device or the like external to light emitting device 1 (an external power source). The pair of feed terminals 60 receive DC power for causing first light emitting element 21 and second light emitting element 22 to emit light, and supply the received DC power to first light emitting element 21 and second light emitting element 22 through wiring pattern 51, wire pad 52, wire 70 and heat transfer pattern 40.

The pair of feed terminals 60 are, for example, metal electrodes (metal terminals) that are patterned in a rectangular shape and formed of a material such as Au. Furthermore, in the present embodiment, one of the pair of feed terminals 60 is a connection terminal on a high voltage side (a positive side), and the other of the pair of feed terminals 60 is a connection terminal on a low voltage side (a negative side).

It should be noted that a socket terminal may be used as feed terminal 60. In this case, feed terminal 60 is constituted by a resin socket and an electrically-conductive part (an electrically-conductive pin) for receiving DC power. The electrically-conductive part is electrically connected to wiring pattern 51 formed on substrate 10.

[Wire]

Wire 70 is an electrically-conductive fine wire for wire bonding of individual first light emitting elements 21 and second light emitting elements 22 and is, for example, a gold wire. More specifically, wire 70 connects first light emitting element 21 or second light emitting element 22 to wire pad 52, and connects second light emitting element 22 to wiring pattern 51 or wire pad 52.

It should be noted that wire 70 may be embedded in sealing member 30 so as not to be exposed from sealing member 30.

[Advantageous Effect, Etc.]

Figure 4A:
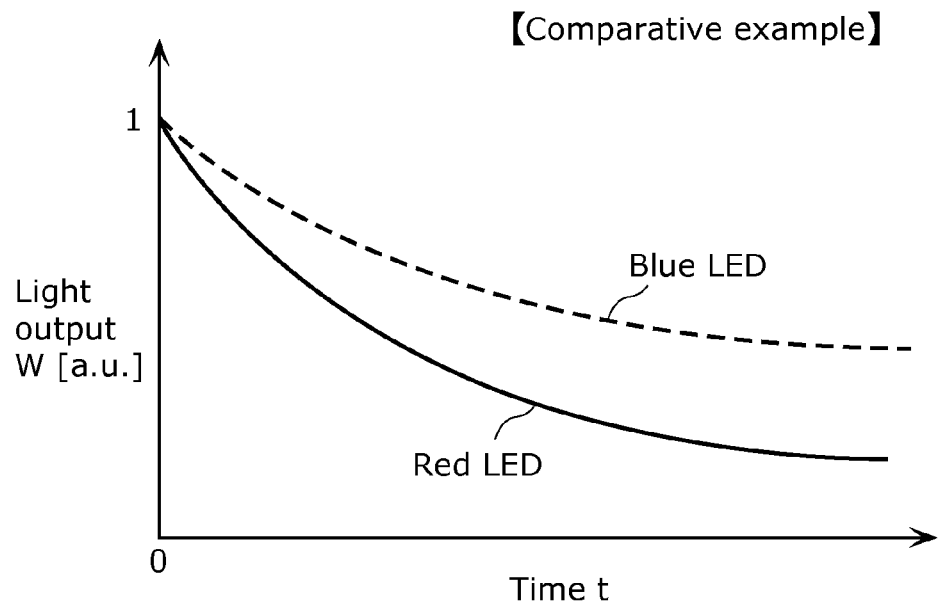
FIG. 4A illustrates a relationship between time elapsed from start of light emission and light output in a light emitting device in a comparative example.
Figure 4B:
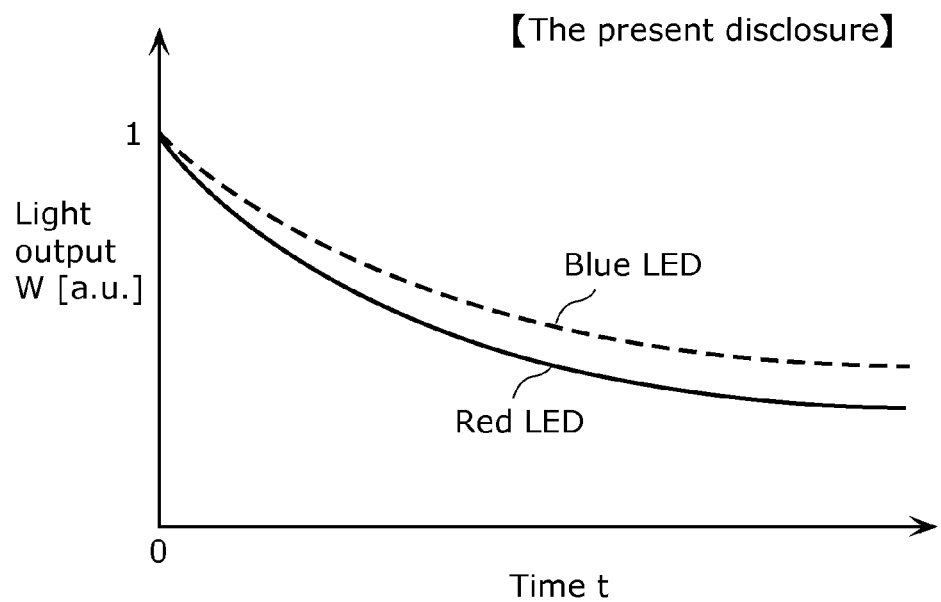
FIG. 4B illustrates a relationship between time elapsed from start of light emission and light output in the light emitting device according to the first exemplary embodiment.

Now, an advantageous effect of light emitting device 1 according to the present embodiment will be described with reference to FIG. 4A and FIG. 4B. FIG. 4A illustrates a relationship between time t elapsed from start of light emission and light output W in a light emitting device in a comparative example, and FIG. 4B illustrates a relationship between time t elapsed from start of light emission and light output W in a light emitting device according to the first exemplary embodiment. It should be noted that the light emitting device in the comparative example includes no heat transfer pattern and has a configuration in which second light emitting element 22 is directly mounted on substrate 10 without heat transfer pattern 40 in light emitting device 1 according to the first exemplary embodiment.

The red LED chip serving as second light emitting element 22 has a greater rate of decrease in light output with respect to a temperature increase [%/° C.] than the blue LED chip serving as first light emitting element 21.

Thus, as illustrated in FIG. 4A, in the light emitting device in the comparative example, the difference in rate of decrease in light output between first light emitting element 21 (blue LED chip) and second light emitting element 22 (red LED chip) becomes greater with a lapse of time t from power-on (t=0; lighting-up). As a result, color of light emitted from the light emitting device in the comparative example varies with the lapse of time t, so that color shift is recognized.

Light emitting device 1 according to the present embodiment is similar to the light emitting device in the comparative example in that the rate of decrease in light output with respect to the temperature increase is greater for second light emitting element 22 (red LED chip) than for first light emitting element 21 (blue LED chip).

In light emitting device 1, second light emitting element 22 (red LED chip) is mounted on heat transfer pattern 40. This makes it possible to spread heat generated in second light emitting element 22 (red LED chip) in a direction parallel with the first principal surface of substrate 10. Accordingly, the heat generated in second light emitting element 22 (red LED chip) is more easily dissipated than heat generated in first light emitting element 21 (blue LED chip). In other words, the temperature increase of second light emitting element 22 is suppressed. Consequently, it is possible to reduce the rate of decrease in light output with respect to the temperature increase of second light emitting element 22.

As a result, as illustrated in FIG. 4B, the rate of decrease in light output of second light emitting element 22 with the lapse of time can be reduced, compared with the light emitting device in the comparative example. It should be noted that FIG. 4A and FIG. 4B show the same rates of decrease in light output of first light emitting element 21 with the lapse of time (the same curves of light output W with respect to time t).

Thus, with light emitting device 1 according to the present embodiment, the difference in rate of decrease in light output between first light emitting element 21 (blue LED chip) and second light emitting element 22 (red LED chip) with the lapse of time t from power-on (t=0; lighting-up) can be made less than that in the light emitting device in the comparative example. Tn other words, it is possible to keep within an acceptable range the color shift owing to the different rates of decrease in light output. As a result, even when the color of light emitted from light emitting device 1 varies with the lapse of time t, the color shift is not recognized easily.

Furthermore, in light emitting device 1 according to the present embodiment, it is possible to combine light emitting elements having different temperature characteristics such as the blue LED chip and the red LED chip. Accordingly, it is possible to generate white light by the blue LED chip and the yellow phosphor and then compensate for a red component with the red LED chip, so that light emitting device 1 having high efficiency and excellent color rendition can be achieved.

As described above, with light emitting device 1 according to the present embodiment, it is possible to both improve the color rendition and suppress the color shift.

Also, in light emitting device 1 according to the present embodiment, heat transfer pattern 40 has a higher thermal conductivity than substrate 10. This allows further improvement of the heat dissipating property of second light emitting elements 22 that has poor temperature characteristics. Thus, the difference in rate of decrease in light output between first light emitting element 21 and second light emitting element 22 can be reduced further. Consequently, the color shift is recognized still less easily.

Moreover, in light emitting device 1 according to the present embodiment, heat transfer pattern 40 is larger than second light emitting element 22 in plan view. In this way, the heat generated in second light emitting element 22 diffuses widely in heat transfer pattern 40, so that a temperature increase of second light emitting element 22 can be suppressed more effectively. Accordingly, the difference in rate of decrease in light output between first light emitting element 21 and second light emitting element 22 can be reduced further. Consequently, the color shift is recognized still less easily.

Additionally, in light emitting device 1 according to the present embodiment, second light emitting element 22 is mounted in an end portion of heat transfer pattern 40. In this way, when a plurality of light emitting elements emitting light of different colors are mounted to substrate 10 as in the present embodiment, a distance between these light emitting elements can be made small, thereby suppressing color unevenness.

Moreover, in light emitting device 1 according to the present embodiment, heat transfer pattern 40 is a metal pattern having a predetermined shape. More specifically, heat transfer pattern 40 is formed of gold. This achieves a high thermal conductivity of heat transfer pattern 40, which is the metal pattern, so that the heat generated in second light emitting element 22 can be dissipated still more efficiently. Thus, the difference in rate of decrease in light output between first light emitting element 21 and second light emitting element 22 can be reduced further. Consequently, the color shift is recognized still less easily.

Furthermore, in the present embodiment, second light emitting element 22, which is the red LED chip, has the double-sided electrode structure in which the p-side electrode (upper surface electrode) is formed on the upper surface of the semiconductor layer and the n-side electrode (lower surface electrode) is formed on the back surface of the substrate. However, there is no particular limitation to this.

Figure 5:
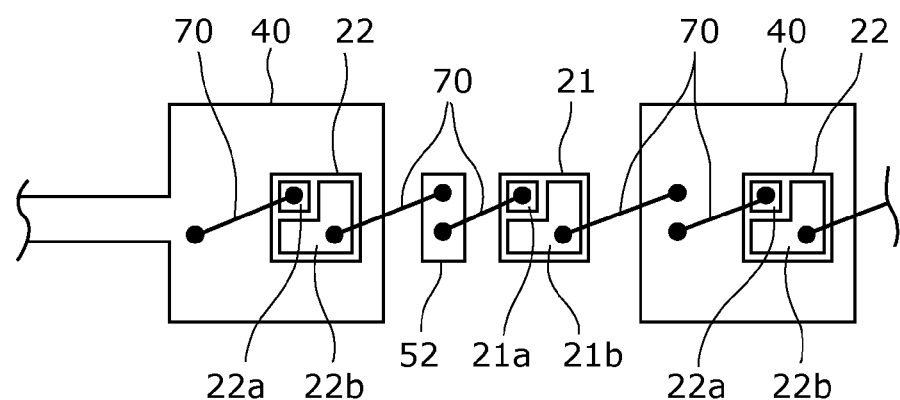
FIG. 5 is an enlarged view illustrating a major portion of a first alternative configuration in the light emitting device according to the first exemplary embodiment.

As illustrated in FIG. 5, for example, second light emitting element 22 may be similar to first light emitting element 21, which is the blue LED chip having the single-sided electrode structure in which n-side electrode 21a and p-side electrode 21b are formed on the upper surface of the semiconductor layer. In other words, a red LED chip having a single-sided electrode structure in which both of n-side electrode 22a and p-side electrode 22b are formed on the upper surface of the semiconductor layer may be used as second light emitting element 22. In this case, second light emitting element 22 and heat transfer pattern 40 are connected by wire bonding using wire 70. Incidentally, sealing member 30 is omitted from FIG. 5.

Although two adjacent light emitting elements are electrically connected via wire pad 52 in the present embodiment, they may be directly connected "chip-to-chip" by wire bonding.

Figure 6:
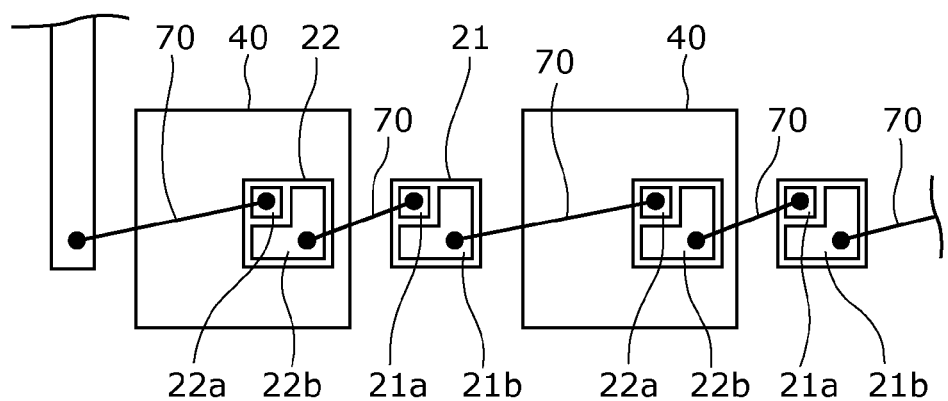
FIG. 6 is an enlarged view illustrating a major portion of a second alternative configuration in the light emitting device according to the first exemplary embodiment.

For example, as illustrated in FIG. 6, first light emitting element 21 and second light emitting element 22 that are adjacent to each other may be directly connected using wire 70. More specifically, n-side electrode 21a of first light emitting element 21 (blue LED chip) and second electrode 22b of second light emitting element 22 (red LED chip) are connected using wire 70, and p-side electrode 21b of first light emitting element 21 and n-side electrode 22a of second light emitting element 22 are connected using wire 70. Incidentally, sealing member 30 is omitted from FIG. 6.

Additionally, although the operating current for operating (causing light emission from) first light emitting element 21 and second light emitting element 22 flows through heat transfer pattern 40 in the present embodiment, such an operating current does not have to flow through heat transfer pattern 40. In other words, heat transfer pattern 40 may be electrically floating with respect to electric potentials of individual electrodes (p-side electrode, n-side electrode) of first light emitting element 21 and second light emitting element 22. In this case, instead of heat transfer pattern 40, a metal line through which the operating current of first light emitting element 21 and second light emitting element 22 flows may be formed on substrate 10 as necessary.

Variation of First Exemplary Embodiment

Figure 7:
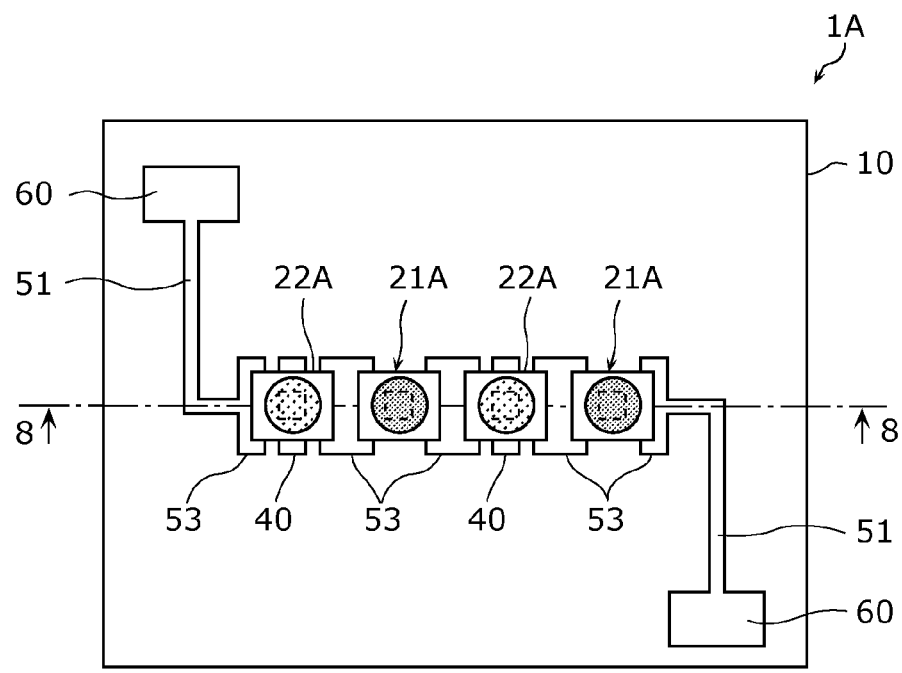
FIG. 7 is a plan view illustrating a light emitting device according to a variation of the first exemplary embodiment.
Figure 8:
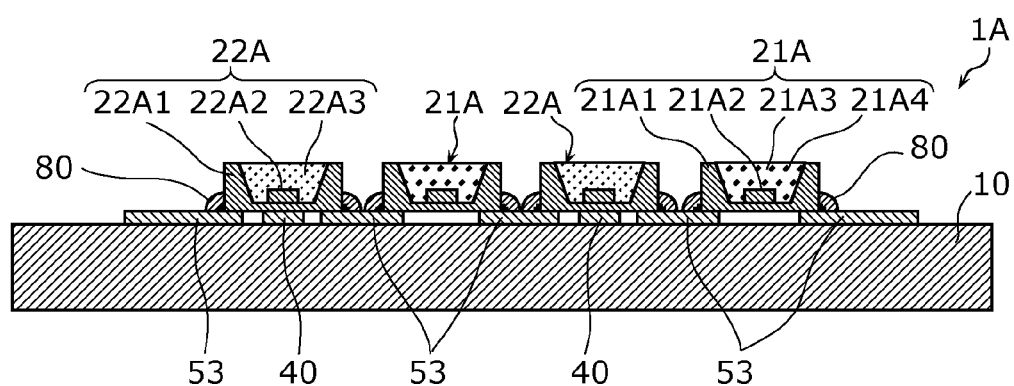
FIG. 8 is a sectional view illustrating the light emitting device according to the variation of the first exemplary embodiment taken along a line 8-8 in FIG. 7.

Now, light emitting device 1A according to a variation of the first exemplary embodiment will be described with reference to FIG. 7 and FIG. 8. FIG. 7 is a plan view illustrating the light emitting device according to a variation of the first exemplary embodiment, and FIG. 8 is a sectional view illustrating this light emitting device taken along a line 8-8 in FIG. 7.

In the first exemplary embodiment described above, the LED chip serving as the light emitting element is mounted above substrate 10. However, in the present variation, a surface mount device (SMD) in which an LED chip is packaged individually is employed.

As illustrated in FIG. 7, light emitting device 1A in the present variation includes substrate 10, first SMDs 21A and second SMDs 22A that are mounted above substrate 10, heat transfer patterns 40, wiring patterns 51, connection wires 53, and a pair of feed terminals 60.

Second SMD 22A is mounted above substrate 10 via heat transfer pattern 40. On the other hand, first SMD 21A is mounted on substrate 10 without heat transfer pattern 40.

As illustrated in FIG. 8, first SMD 21A includes first container 21A1, first light emitting element 21A2 that is mounted in first container 21A1, and first sealing member 21A3 that seals first light emitting element 21A2.

Also, second SMD 22A includes second container 22A1, second light emitting element 22A2 that is mounted in second container 22A1, and second sealing member 22A3 that seals second light emitting element 22A2.

First container 21A1 and second container 22A1 are a package molded out of a white resin, for example, and have a cavity. An internal lateral surface of the cavity is inclined so as to upwardly reflect light from first light emitting elements 21A2 or second light emitting elements 22A2.

First light emitting element 21A2 is the same as the blue LED chip in the first exemplary embodiment. Also, second light emitting element 22A2 is the same as the red LED chip in the first exemplary embodiment. In other words, the rate of decrease in light output with respect to the temperature increase is greater for second light emitting element 22A2 than for first light emitting element 21A2.

Second sealing member 22A3 is sealed in second container 22A1. Second sealing member 22A3 in the present variation may have a configuration similar to sealing member 30 in the first exemplary embodiment.

Second light emitting element 22A2 is sealed by second sealing member 22A3 and mounted in second container 22A1. Second light emitting element 22A2 is mounted above substrate 10 such that second container 22A1 and heat transfer pattern 40 are located immediately below second light emitting element 22A2.

On the other hand, first sealing member 21A3 is sealed in first container 21A1. First sealing member 21A3 is a light-transmitting resin, for example, a silicone resin containing wavelength conversion material 21A4 such as a yellow phosphor. In other words, synthesis light of light from first light emitting element 21A2 and light from wavelength conversion material 21A4 is emitted from first SMD 21A. In the case where wavelength conversion material 21A4 is a yellow phosphor, white light is emitted from first SMD 21A.

First light emitting element 21A2 is sealed by first sealing member 21A3 containing wavelength conversion material 21A4 and mounted in first container 21A1. First light emitting element 21A2 is mounted above substrate 10 via first container 21A1 without heat transfer pattern 40.

Also, connection wire 53 is a metal line formed in a predetermined shape on the first principal surface of substrate 10, and provided for arranging a plurality of the light emitting elements above the substrate in a predetermined (serial/parallel/serial parallel) connection. More specifically, as illustrated in FIG. 7 and FIG. 8, in order to connect first SMD 21A and second SMD 22A that are adjacent to each other, connection wire 53 is disposed between first SMD 21A and second SMD 22A.

In the present variation, two first SMDs 21A and two second SMDs 22A are connected in series by connection wires 53 similarly to the first exemplary embodiment. For example, as illustrated in FIG. 8, first SMD 21A or second SMD 22A is connected to connection wire 53 by connecting a lead terminal of first SMD 21A or second SMD 22A to connection wire 53 using electrically-conductive adhesive 80 such as solder.

It should be noted that connection wire 53 is formed by patterning using the same metallic material as heat transfer pattern 40 and wiring pattern 51 in a single process.

As described above, with light emitting device 1A according to the present variation, it is possible to produce an advantageous effect similar to the first exemplary embodiment.

In other words, with light emitting device 1A according to the present variation, it is possible to reduce the difference in rate of decrease in light output between first SMD 21A including the blue LED chip and second SMD 22A including the red LED chip even after a lapse of time t from power-on (t=0; lighting-up), compared with the case of providing no heat transfer pattern 40. As a result, even when the color of light emitted from light emitting device 1A varies with the lapse of time t, the color shift is not recognized easily.

Furthermore, since the blue LED chip and the red LED chip can be combined similarly to the first exemplary embodiment, it is possible to achieve light emitting device 1A that has high efficiency and excellent color rendition.

Thus, with light emitting device 1A according to the present variation, it becomes possible to both improve the color rendition and suppress the color shift.

Although the operating current of first light emitting element 21A or second light emitting element 22A does not flow through heat transfer pattern 40 in the present variation, it may be also possible to adopt the configuration in which the operating current of first light emitting element 21A and second light emitting element 22A flows through heat transfer pattern 40. For example, connection wire 53 and heat transfer pattern 40 may be connected.

Second Exemplary Embodiment

Figure 9:
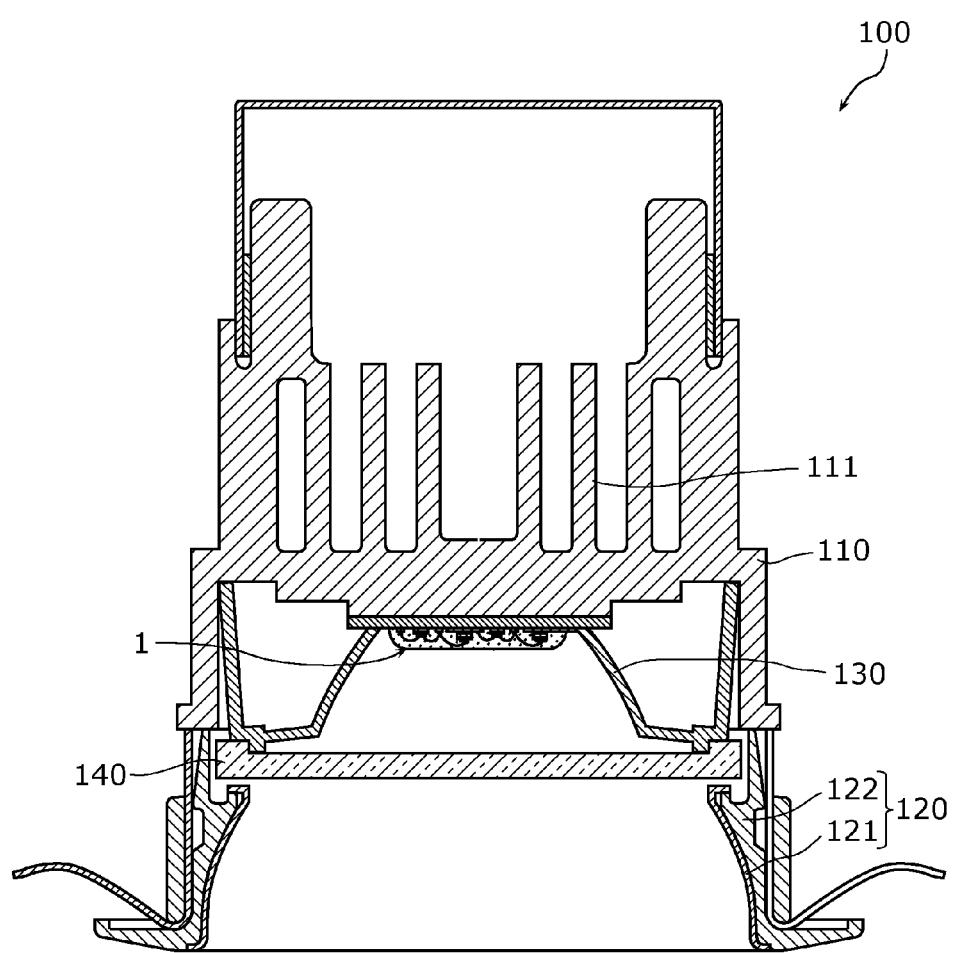
FIG. 9 is a sectional view illustrating an illumination apparatus according to a second exemplary embodiment.
Figure 10:
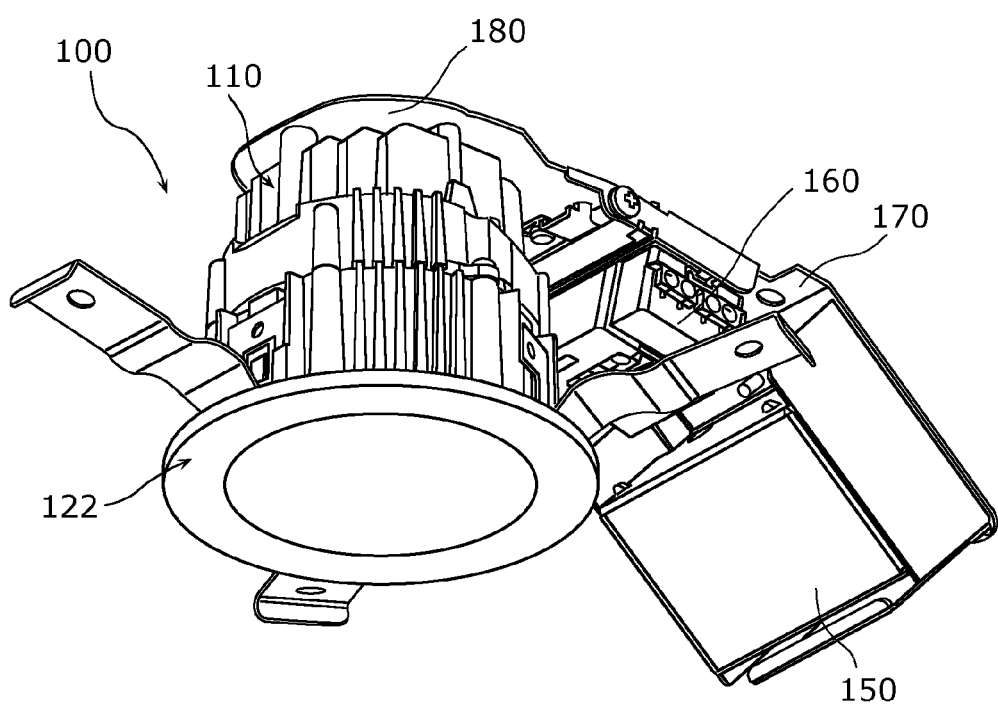
FIG. 10 is a perspective view illustrating an external appearance of the illumination apparatus according to the second exemplary embodiment and peripheral components (a lighting device and a terminal base) connected to the illumination apparatus.

Now, illumination apparatus 100 according to a second exemplary embodiment will be described with reference to FIG. 9 and FIG. 10. FIG. 9 is a sectional view illustrating illumination apparatus 100 according to the second exemplary embodiment. FIG. 10 is a perspective view illustrating an external appearance of illumination apparatus 100 according to the second exemplary embodiment and peripheral components (a lighting device and a terminal base) connected to illumination apparatus 100.

As illustrated in FIG. 9 and FIG. 10, illumination apparatus 100 according to the present embodiment is an embedded-type illumination apparatus such as a downlight that is embedded in a ceiling of a house so as to illuminate a downward location (such as a hallway or a wall), for example. Illumination apparatus 100 includes light emitting device 1 serving as an LED light source, an apparatus main body that is formed by connecting base 110 and frame unit 120 and is substantially shaped as a bottomed tube, and reflector 130 and light-transmitting panel 140 that are mounted to the apparatus main body.

Base 110 serves as not only an attachment base to which light emitting device 1 is attached but also a heat sink that dissipates heat generated in light emitting device 1. Base 110 is formed to have a substantially columnar shape using a metallic material and, in the present embodiment, produced by aluminum die-casting.

In an upper portion (a portion toward the ceiling) of base 110, a plurality of heat dissipation fins 111 that project upward are provided at certain intervals along a single direction. This makes it possible to efficiently dissipate the heat generated in light emitting device 1.

Frame unit 120 includes substantially cylindrical cone part 121 that has a reflective surface on its internal surface, and frame main body part 122 to which cone part 121 is attached. Cone part 121 is molded using a metallic material, and can be produced by drawing or press-forming an aluminum alloy or the like, for example. Frame main body part 122 is molded using a hard resin material or a metallic material. Frame main body part 122 is attached to base 110, whereby frame unit 120 is secured.

Reflector 130 is an annular frame-shaped (funnel-shaped) reflecting component having an internal reflection function. Reflector 130 can be formed using a metallic material, for example, aluminum or the like. Incidentally, reflector 130 may be formed using a hard white resin material instead of the metallic material.

Light-transmitting panel 140 is a light-transmitting component having a light diffusion property and a light transmitting property. Light-transmitting panel 140 is a flat plate disposed between reflector 130 and frame unit 120, and is attached to reflector 130. Light-transmitting panel 140 can be formed to have a disc shape using a transparent resin material, for example, an acrylic resin or a polycarbonate resin.

It should be noted that light-transmitting panel 140 does not have to be provided. The configuration without light-transmitting panel 140 can increase light flux of the illumination apparatus.

As illustrated in FIG. 10, lighting device 150 that feeds lighting power to light emitting device 1 and terminal base 160 that passes on AC power from a commercial power source to lighting device 150 are connected to illumination apparatus 100.

Lighting device 150 and terminal base 160 are firmly attached to attachment plate 170, which is provided separately from the apparatus main body. Attachment plate 170 is formed by bending a rectangular plate member formed of a metallic material. Lighting device 150 is firmly attached to a lower surface of one end portion along a longitudinal direction of attachment plate 170, and terminal base 160 is firmly attached to a lower surface of the other end portion thereof. Attachment plate 170 is connected to top plate 180 that is firmly attached to an upper portion of base 110 of the apparatus main body.

As described above, light emitting device 1 according to the present embodiment can be implemented in illumination apparatus 100 such as a downlight. With illumination apparatus 100 configured as above, the provision of light emitting device 1 according to the first exemplary embodiment makes it possible to both improve the color rendition and suppress the color shift.

In particular, the color rendition is demanded of the downlight and the spotlight, which illuminate particular products or goods in a store or the like. Accordingly, the use of light emitting device 1 according to the present embodiment meets the demand for the color rendition and suppresses the color shift effectively.

Third Exemplary Embodiment

Figure 11:
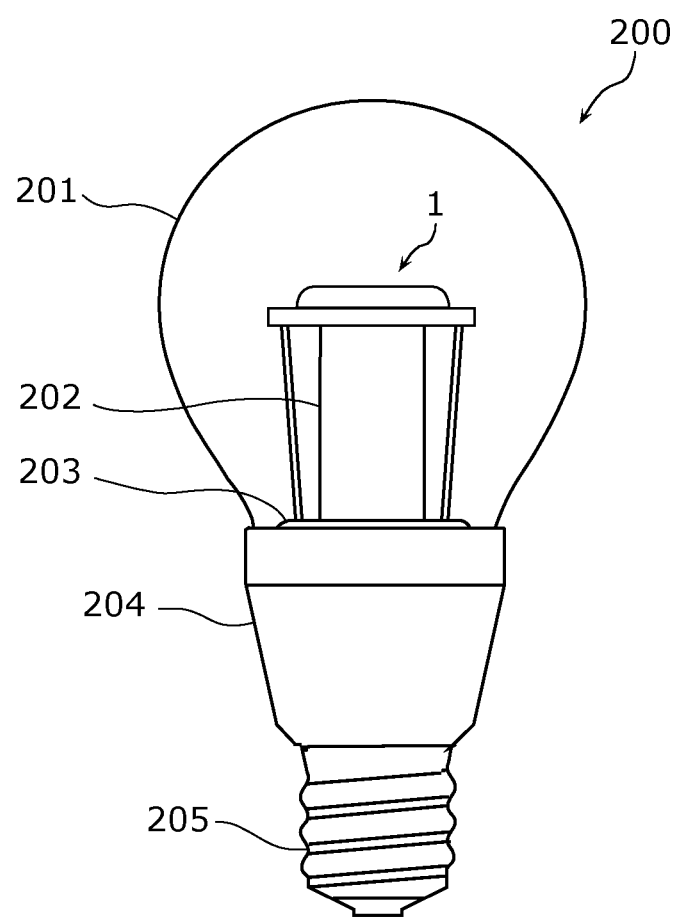
FIG. 11 illustrates an outline of a configuration of a bulb-shaped lamp according to a third exemplary embodiment.

Now, a configuration of bulb-shaped lamp 200 according to a third exemplary embodiment will be described with reference to FIG. 11. FIG. 11 illustrates an outline of the configuration of the bulb-shaped lamp according to the third exemplary embodiment.

Bulb-shaped lamp 200 illustrated in FIG. 11 is an example of a light source for illumination, and includes light emitting device 1 according to the first exemplary embodiment described above.

Bulb-shaped lamp 200 includes light-transmitting globe 201, light emitting device 1 serving as a light source, housing 204 that receives a drive circuit for supplying electric power to light emitting device 1, and lamp base 205 that receives external electric power.

AC power received by lamp base 205 is converted to DC power by the drive circuit and supplied to light emitting device 1. Incidentally, in the case where DC power is supplied to lamp base 205, the drive circuit does not have to have a conversion function from DC to AC.

Also, in the present embodiment, light emitting device 1 is supported by support posts 202 and located in a central portion of globe 201. Support posts 202 are metallic rods that extend from a vicinity of an opening of globe 201 toward an internal space of globe 201.

More specifically, support posts 202 are connected to support base 203 that is disposed in the vicinity of the opening of globe 201.

It should be noted that there is no particular need to provide support posts 202. In this case, light emitting device 1 may be supported directly by support base 203 instead of support posts 202. In other words, light emitting device 1 may be attached to a surface of support base 203 facing globe 201.

Globe 201 is a light-transmitting cover that transmits light from light emitting device 1 to an outside. Globe 201 in the present embodiment is formed of a material transparent to light from light emitting device 1. As such globe 201, for example, a glass bulb made of silica glass that is transparent to visible light (a clear bulb) is adopted. In this case, light emitting device 1 received in globe 201 can be visually identified from the outside of globe 201.

It should be noted that globe 201 does not have to be transparent to visible light but may have a light diffusion function. For example, the light diffusion function can be provided by applying a white pigment, a resin containing a light diffusion material such as silica or calcium carbonate, or the like to an entire internal or external surface of globe 201 so as to form a milky-white light diffusion film, or by providing roughness on the surface of globe 201. A material of globe 201 is not limited to glass but may be a resin such as a synthetic resin, for example, an acrylic (PMMA) resin or a polycarbonate (PC) resin.

Furthermore, a shape of globe 201 is not particularly limited but may be hemispherical, for example, when light emitting device 1 is directly supported by support base 203 (no support post 202 is provided).

As described above, light emitting device 1 according to the present embodiment can be implemented in bulb-shaped lamp 200. With bulb-shaped lamp 200 configured as above, the provision of light emitting device 1 according to the first exemplary embodiment makes it possible to both improve the color rendition and suppress the color shift.

Incidentally, light emitting device 1 in the present embodiment can be implemented as a light source for illumination in a straight tube lamp or the like instead of the bulb-shaped lamp.

Also, such a bulb-shaped lamp can be implemented in an illumination apparatus including this bulb-shaped lamp. For example, the illumination apparatus can be constituted by the above-noted bulb-shaped lamp and a luminaire (lighting apparatus) to which the bulb-shaped lamp is attached. In this case, the luminaire includes, for example, an apparatus main body that is attached to a ceiling and has a socket in which the lamp base of the bulb-shaped lamp is mounted, and a cover that covers the bulb-shaped lamp.

Moreover, the straight tube lamp can also be implemented in an illumination apparatus including this straight tube lamp. For example, the illumination apparatus can be constituted by the straight tube lamp and a luminaire (lighting apparatus) including a pair of sockets to which the straight tube lamp is attached.

Other Variations, Etc.

Although the light emitting device, the light source for illumination and the illumination apparatus according to the present disclosure have been described above based on the embodiments, the present disclosure is not limited to the embodiments described above.

For example, in the light emitting device according to the above-described embodiments, white light has been generated by combining the blue LED chip and the yellow phosphor. However, a configuration for generating white light is not limited to the above. More specifically, a phosphor-containing resin containing a red phosphor and a green phosphor may be used and combined with the blue LED chip, thereby generating the white light. Alternatively, an ultraviolet LED chip that emits ultraviolet light, which has a wavelength shorter than the wavelength of the blue LED chip, and phosphors of respective colors that are excited mainly by ultraviolet light and emit light of three primary colors (red, green and blue) may be combined, thereby generating the white light.

Furthermore, although the phosphor has been used as the wavelength conversion material in the embodiments described above, there is no particular limitation to this. For example, the wavelength conversion material may be a material containing a substance that absorbs light at a certain wavelength and emits light at a wavelength different from the absorbed light, such as a semiconductor, a metal complex, an organic dye, or a pigment.

Moreover, although the LED chip has been illustrated in the embodiments described above, the LED chip may be replaced with a semiconductor light emitting element such as semiconductor laser, an electro luminescence (EL) element such as an organic EL element or an inorganic EL element, or other solid-state light emitting elements.

Additionally, although the embodiments described above have illustrated the example of applying the light emitting device to the downlight or the spotlight, there is no particular limitation to this. For example, the light emitting device in the embodiments described above may also be utilized as a light source of other luminaires (illumination apparatuses) such as a base light. In this case, the base light may also have a configuration in which the light emitting device is directly attached to the base. Moreover, the light emitting device according to the embodiments described above can also be utilized as a light source for uses other than illumination such as a light source for a backlight in a liquid crystal display apparatus or the like, a light source for a lamp in a copier or the like, or a light source for a guide light, a billboard or the like.

Other than the above, a mode obtained by making various modifications conceivable by a person skilled in the art to each of the embodiments or a mode realized by freely combining structural components and functions in each of the embodiments without departing from the purport of the present disclosure also falls within the scope of the present disclosure.

What is claimed is:

1. A light emitting device comprising:
   a substrate;
   a first light emitter and a second light emitter mounted above the substrate;
   a seal containing a wavelength conversion material, the seal collectively sealing the first light emitter and the second light emitter linearly along an alignment direction thereof, an outer shape of the seal being cylindrical, and a cross section of the seal being semi-circular when taken along a plane perpendicular to a longitudinal direction thereof; and
   a rectangular heat transfer pattern on the substrate,
   wherein a rate of decrease in light output with respect to a temperature increase is greater for the second light emitter than for the first light emitter,
   the second light emitter is mounted above the substrate via the heat transfer pattern,
   the first light emitter is mounted above the substrate without the heat transfer pattern, and
   a portion of the heat transfer pattern extends beyond a periphery of the seal, exposing the portion of the heat transfer pattern.

2. The light emitting device according to claim 1, wherein the heat transfer pattern has a thermal conductivity higher than a thermal conductivity of the substrate.

3. The light emitting device according to claim 1, wherein the heat transfer pattern is larger than the second light emitter in planar view of the light emitting device.

4. The light emitting device according to claim 3, wherein the second light emitter is mounted in an end portion of the heat transfer pattern.

5. The light emitting device according to claim 1, wherein the heat transfer pattern is a metal pattern.

6. The light emitting device according to claim 1, wherein an operating current for operating the first light emitter and the second light emitter flows through the heat transfer pattern.

7. The light emitting device according to claim 1, further comprising:
   a metal line through which an operating current for operating the first light emitter and the second light emitter flows,
   wherein the operating current for operating the first light emitter and the second light emitter does not flow through the heat transfer pattern.

8. The light emitting device according to claim 1, wherein the first light emitter is a blue light emitting diode (LED) chip,
   the second light emitter is a red LED chip, and
   the wavelength conversion material is a yellow phosphor.

9. A light source for illumination, comprising the light emitting device according to claim 1.

10. An illumination apparatus comprising the light emitting device according to claim 1.

11. A light emitting device comprising:
   a substrate;
   a first light emitter and a second light emitter mounted above the substrate;
   a seal sealing the second light emitter; and
   a rectangular heat transfer pattern on the substrate,
   wherein a rate of decrease in light output with respect to a temperature increase is greater for the second light emitter than for the first light emitter,
   the second light emitter is mounted in an end portion of the heat transfer pattern and off-center of the heat transfer pattern,
   the first light emitter is mounted above the substrate without the heat transfer pattern,
   a portion of the heat transfer pattern extends beyond a periphery of the seal, exposing the portion of the heat transfer pattern,
   the seal collectively seals the first light emitter and the second light emitter arranged in a row, and
   two side portions of the heat transfer pattern in a direction perpendicular to an arrangement direction of the second emitter extend beyond the periphery of the seal.

* * * * *